United States Patent
Waldrip et al.

(10) Patent No.: US 6,577,163 B1
(45) Date of Patent: Jun. 10, 2003

(54) CONFIGURABLE PCI CLAMP OR HIGH VOLTAGE TOLERANT I/O CIRCUIT

(75) Inventors: Jeffrey W. Waldrip, Austin, TX (US); Muthukumar Nagarajan, Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 195 days.

(21) Appl. No.: 09/745,658

(22) Filed: Dec. 21, 2000

(51) Int. Cl.$^7$ .......................................... H03K 19/0175
(52) U.S. Cl. ............................ 326/81; 326/57; 326/21
(58) Field of Search ............................ 326/80, 81, 56, 326/57, 58, 21, 33, 14

(56) References Cited

U.S. PATENT DOCUMENTS

| | | | |
|---|---|---|---|
| 5,629,634 A | * | 5/1997 | Carl et al. ................... 326/27 |
| 5,825,206 A | * | 10/1998 | Krishnamurthy et al. ..... 326/81 |
| 5,874,838 A | | 2/1999 | Rees ........................... 326/86 |
| 5,914,844 A | | 6/1999 | Lutley et al. ............... 361/111 |
| 6,255,850 B1 | * | 7/2001 | Turner .......................... 326/81 |
| 6,265,926 B1 | * | 7/2001 | Wong ........................... 327/318 |

OTHER PUBLICATIONS

PCI Local Bus Specification, Revision 2.2, Dec. 18, 1998, pp. 1–302.

* cited by examiner

Primary Examiner—Daniel Chang
(74) Attorney, Agent, or Firm—Christopher P. Maiorana, P.C.

(57) ABSTRACT

An apparatus comprising one or more input/output circuits that may be configured as (i) high voltage tolerant in response to a first state of a control input and (ii) a clamp to a power supply voltage in response to a second state of said control input.

17 Claims, 4 Drawing Sheets

US 6,577,163 B1

CONFIGURABLE PCI CLAMP OR HIGH VOLTAGE TOLERANT I/O CIRCUIT

FIELD OF THE INVENTION

The present invention relates to input/output (I/O) circuits generally and, more particularly, to a method and/or architecture for a configurable PCI clamp or high voltage tolerant I/O circuit.

BACKGROUND OF THE INVENTION

Input/output (I/O) circuits are used to communicate signals between electronic circuits. For example, input/output circuits connect internal circuitry to bond pads in integrated circuits. Some applications of integrated circuits can place a voltage (VPAD) on the bond pads that is higher than the operating voltage (VCC) of the integrated circuit (chip). When the pad voltage exceeds VCC, an I/O circuit can be required to either (i) clamp the pad to the chip power supply (see the PCI specification, revision 2.2, published Dec. 18, 1998) or (ii) be high voltage tolerant (i.e., the I/O circuit can handle a voltage on the pad that is higher than the chip supply voltage).

Referring to FIG. 1, a diagram of a circuit 10 illustrating a standard PMOS output driver is shown. The circuit 10 provides a clamp from an I/O pad to a supply voltage VCCIO when a voltage at the pad (VPAD)is greater than VCCIO. However, the circuit 10 does not provide high voltage tolerance.

Referring to FIG. 2, a diagram of a circuit 20 illustrating a high voltage tolerant I/O circuit is shown. The circuit 20 provides a high voltage tolerant circuit, but no configurable clamp. When the circuit 20 is in a tristate mode (i.e., output not enabled), the n-wells of the PMOS devices will generally be a diode drop below VCCIO or VPAD, whichever has the higher voltage.

Referring to FIG. 3, a diagram of a circuit 30 illustrating a brute force implementation of a high voltage tolerant I/O circuit with clamp capability is shown. The circuit 30 includes an output driver 32 with two PMOS devices 34 and 36 in series and a HV tolerance circuit (not shown). The HV tolerance circuit can be similar to PGATE generation and n-well bias circuits of FIG. 2. The PMOS device 34 is driven by an output buffer 38. The PMOS device 36 is driven by a clamp enable signal that is level shifted to a substrate voltage (NSUB) by a level shifter 40. The voltage NSUB is the higher of the voltage VPAD or VCCIO. The circuit 30 has disadvantages of requiring a large area to implement and producing a large speed impact.

SUMMARY OF THE INVENTION

The present invention concerns an apparatus comprising one or more input/output circuits that may be configured as (i) high voltage tolerant in response to a first state of a control input and (ii) a clamp to a supply voltage in response to a second state of the control input.

The objects, features and advantages of the present invention include providing a method and/or architecture for a configurable PCI clamp or high voltage tolerant I/O circuit that may (i) provide high voltage tolerance feature that may be configured on or off, (ii) support both I/O standards requiring a clamp to VCCIO and standards requiring high voltage tolerance, (iii) use an existing PMOS output driver and tolerance circuit to clamp a pad, (iv) be implemented without requiring significant area, (v) have little speed impact, (vi) provide an I/O circuit that supports multiple I/O standards that require high voltage tolerance, (vii) provide an I/O circuit that supports the PCI specification, rev 2.2, without the addition of an external clamping diode.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 4:
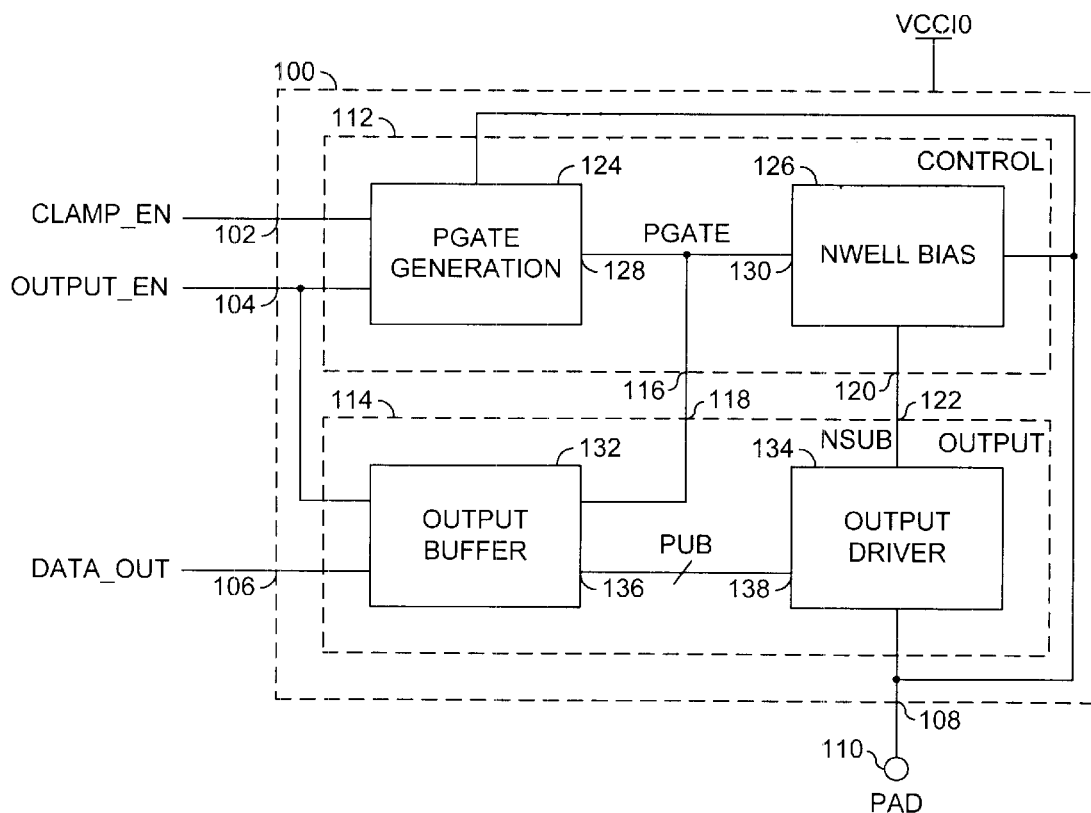
FIG. 4 is a block diagram illustrating a preferred embodiment of the present invention.

Referring to FIG. 4, a block diagram of a circuit 100 illustrating a preferred embodiment of the present invention is shown. The circuit 100 may be configured as either a high voltage tolerant input/output circuit (e.g., the circuit can handle a higher voltage on the pad than the chip power supply), or a clamp from pad to chip power supply (e.g., VCCIO) when the pad voltage (e.g., VPAD) exceeds VCCIO. In one example, the circuit 100 may be implemented to provide a clamp in accordance with the PCI specification (rev 2.2), which is hereby incorporated by reference in its entirety. Alternatively, the circuit 100 may be configured to support other I/O standards requiring high voltage tolerance.

The circuit 100 may be implemented as a configurable PCI clamp or high voltage tolerant I/O circuit. The circuit 100 may have an input 102 that may receive a signal (e.g., CLAMP_EN), an input 104 that may receive a signal (e.g., OUTPUT_EN), an input 106 that may receive a signal (e.g., DATA_OUT), and an output 108 that may present a signal (e.g., PAD). The output 108 may be connected to a pad 110. The circuit 100 may be configured to operate at a supply voltage (e.g., VCCIO). The pad 110 may have a voltage level that may be equal to or greater than the supply voltage VCCIO. The signals CLAMP_EN and OUTPUT_EN may be enable or control signals. The circuit 100 may be configured to clamp the pad 110 to the supply voltage VCCIO in response to an asserted state (e.g., a logic HIGH) of the signal CLAMP_EN or the signal OUTPUT_EN. The signal DATA_OUT may be a data signal that may comprise data for presentation at the pad 110.

The circuit 100 may comprise a circuit 112 and a circuit 114. The circuit 112 may be implemented as a control circuit. The circuit 114 may be implemented as an output circuit. The signals CLAMP_EN, OUTPUT_EN and PAD may be presented to inputs of the circuit 112. The circuit 112 may have (i) an output 116 that may present a signal (e.g., PGATE) to an input 118 of the circuit 114 and (ii) an output 120 that may present a signal (e.g., NSUB) to an input 122 of the circuit 114. The signal PGATE may be a control signal that stays low enough during normal operation to keep the PFETS in the CMOS switch and NSUB driver turned on. However, during a high voltage condition, the signal PGATE generally is at the voltage of the pad 110 to prevent current from flowing from the pad 110 to VCCIO (for the high voltage tolerant case). The signal NSUB is the n-well bias voltage. The circuit 112 may be configured to generate the signals PGATE and NSUB in response to one or more of the signals CLAMP_EN, OUTPUT_EN, PAD, and VCCIO.

The signals OUTPUT_EN and DATA_OUT may be presented to inputs of the circuit 114. The circuit 114 may be configured to present the signal PAD in response to the signals OUTPUT_EN, DATA_OUT, PGATE, NSUB, and VCCIO.

The circuit 112 may comprise a circuit 124 and a circuit 126. The circuit 124 may be implemented as a PGATE voltage generator. The circuit 126 may be implemented as an n-well bias circuit. The circuit 124 may be configured to generate the signal PGATE in response to the signals CLAMP_EN, OUTPUT_EN, PAD and VCCIO. The circuit 126 may be configured to generate the signal NSUB in response to the signals PGATE and PAD and the supply voltage VCCIO.

The circuit 114 may comprise a circuit 132 and a circuit 134. The circuit 132 may be implemented as an output buffer circuit. The circuit 134 may be implemented as an output driver circuit. The signals OUTPUT_EN, DATA_OUT, PGATE, and PAD may be presented to inputs of the circuit 132. The circuit 132 may have an output 136 that may present a signal (e.g., PUB) to an input 138 of the circuit 134.

The signal NSUB may be presented to an input of the circuit 134. The circuit 134 may be configured to generate the signal PAD in response to the signals PUB and NSUB and the supply voltage VCCIO.

Figure 5:
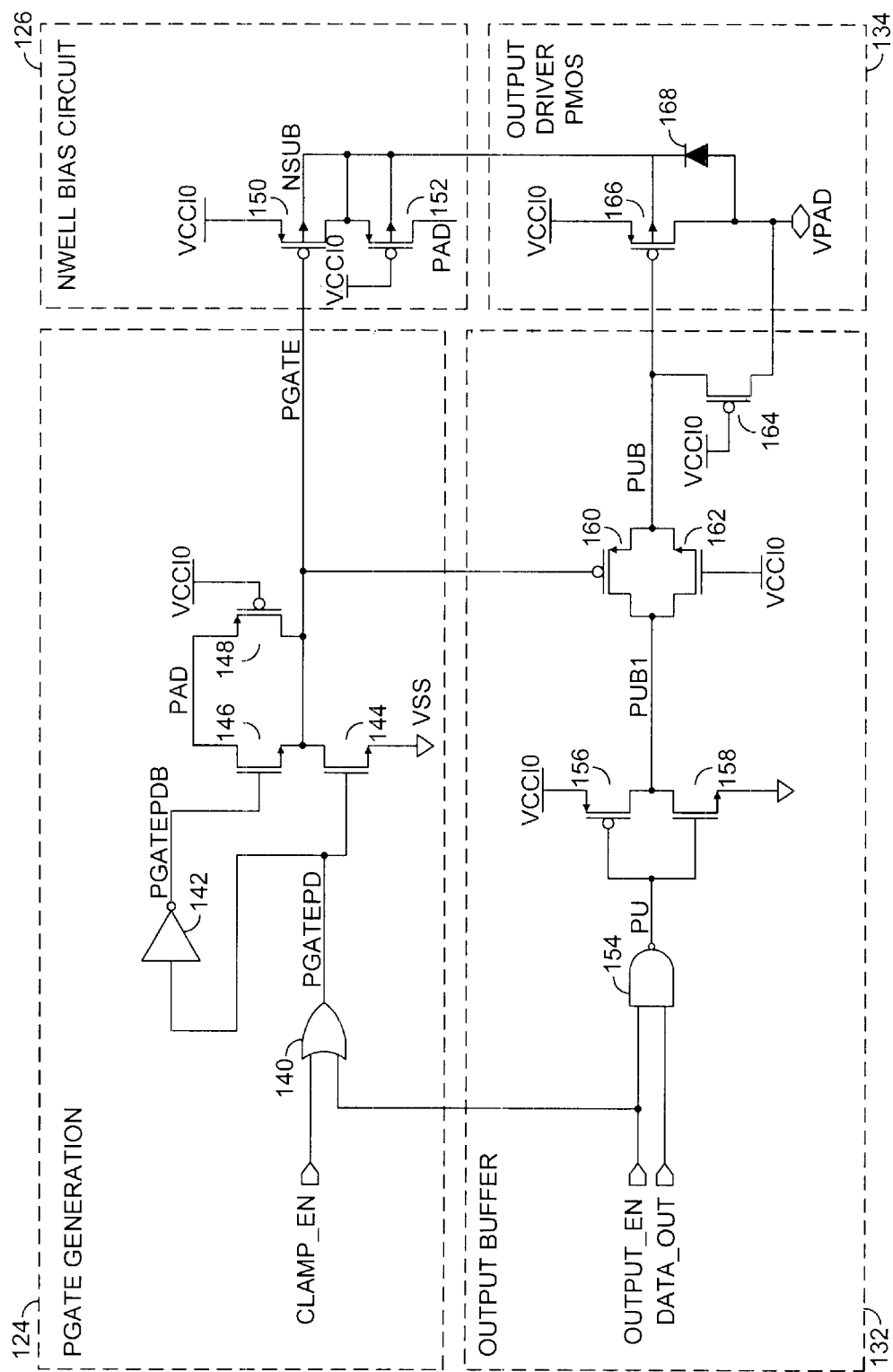
FIG. 5 is a schematic of the circuit of FIG. 4.

Referring to FIG. 5, a schematic diagram of the circuit 100 illustrating an implementation of the present invention is shown. The circuit 124 may comprise a gate 140, a gate 142, a transistor 144, a transistor 146 and a transistor 148. The gate 140 may be implemented, in one example, as an OR gate. The gate 142 may be implemented as an inverter. However, other types of gates may be implemented accordingly to meet the design criteria of a particular application. The transistors 144 and 146 may be implemented as one or more NMOS transistors. The transistor 148 may be implemented as one or more PMOS transistors. However, other types of transistors may be implemented accordingly to meet the design criteria of a particular application. The signal OUTPUT_EN may be presented to a first input of the gate 140. The signal CLAMP_EN may be presented to a second input of the gate 140. An output of the gate 140 may present a signal (e.g., PGATEPD) to an input of a gate 142 and a gate of the transistor 144. An output of the gate 142 may present a signal (e.g., PGATEPDB) to a gate of the transistor 146. A source of the transistor 144 may be connected to a voltage supply ground (e.g., VSS). A drain of the transistor 144 may be connected to a source of the transistor 146 and a drain of the transistor 148. The signal PGATE may be presented at a node formed by the connection of the source/drains of the transistors 144, 146 and 148, respectively. A drain of the transistor 146 and a source of the transistor 148 may be configured to receive the signal PAD. A gate of the transistor 148 may be connected to the supply voltage VCCIO.

The circuit 126 may comprise a transistor 150 and a transistor 152. The transistors 150 and 152 may be implemented as one or more PMOS transistors. However, other types and polarities of transistors may be implemented accordingly to meet the design criteria of a particular application. The signal PGATE may be presented to a gate of the transistor 150. A source of the transistor 150 may be connected to the supply voltage VCCIO. A substrate terminal and a drain of the transistor 150 may be connected to a source and a substrate terminal of the transistor 152. The signal NSUB may be presented at a node formed by the connection of the substrates of the transistors 150 and 152 and the drain and source of the transistors 150 and 152, respectively. A gate of the transistor 152 may be connected to the supply voltage VCCIO. A drain of the transistor 152 may be configured to receive the signal PAD.

The circuit 132 may comprise a gate 154, a transistor 156, a transistor 158, a transistor 160, a transistor 162 and a transistor 164. The gate 154 may be implemented as a two input AND gate. However, other types of gates may be implemented accordingly to meet the design criteria of a particular application. The transistors 156, 160 and 164 may be implemented as one or more PMOS transistors. The transistors 158 and 162 may be implemented as one or more NMOS transistors. However, other types of transistors may be implemented accordingly to meet the design criteria of a particular application. The signal OUTPUT_EN may be presented to a first input of a gate 154. The signal DATA_OUT may be presented to a second input of the gate 154. An output of the gate 154 may present a signal (e.g., PU) to a gate of the transistor 156 and a gate of the transistor 158. A source of the transistor 156 may be connected to the supply voltage VCCIO. A drain of the transistor 156 may be connected to a drain of the transistor 158. A source of the transistor 158 may be connected to a voltage supply ground VSS. The transistors 156 and 158 may form a CMOS inverter. A signal (e.g., PUBI) may be presented at a node formed by the connection of the drains of the transistors 156 and 158.

The transistors 160 and 162 may be connected to form a CMOS pass gate or transmission gate. The signal PUBI may be presented to an input of the transmission gate formed by the transistors 160 and 162. The signal PGATE may be presented to a gate of the transistor 160. The supply voltage VCCIO may be presented to a gate of the transistor 162. An output of the transmission gate formed by the transistors 160 and 162 may present the signal PUB and may be connected to a source of the transistor 164. A gate of the transistor 164 may be connected to the supply voltage VCCIO. A drain of the transistor 164 may be configured to receive the signal PAD.

The circuit 134 may comprise a transistor 166 and a diode 168. The transistor 166 may be implemented as one or more PMOS transistors. However, other types or polarities of transistors may be implemented accordingly to meet the design criteria of a particular application. The diode 168 may be a parasitic junction diode of the output driver FET. However, more diode area may be added to clamp the pad when the circuit 100 is not in the high voltage tolerant mode. For example, the diode 168 may be implemented as an NP junction diode. Alternatively, the diode 168 may be implemented using a diode connected transistor or other configuration necessary to meet the design criteria of a particular application. The signal PUB may be presented to a gate of a transistor 166. A source of the transistor 166 may be connected to the supply voltage VCCIO. A substrate connection of the transistor 166 may be connected to a first terminal of the device 168. A drain of the transistor 166 may be connected to a second terminal of the device 168 and the pad 110. The signal NSUB may be presented to the substrate terminal of the transistor 166 and the first terminal of the device 168.

In general, all of the n-wells of the PMOS transistors 148, 150, 152, 156, 160, 164 and 166 may be connected to the signal NSUB. When the signal OUTPUT_EN or the signal CLAMP_EN is asserted (e.g., a logic HIGH or "1"), the signal PGATE may be in an unasserted state (e.g., a logic LOW or "0"). When the signals OUTPUT_EN and CLAMP_EN are both unasserted (e.g., a logic LOW or "0"), the signal PGATE will generally depend upon the voltage level of the pad 110. When the signal PAD has a voltage level that is less than VCCIO+VTP, the signal PGATE may have a voltage that is less than VCCIO−VTN. When the pad voltage is greater than VCCIO+VTP, the voltage level of the signal PGATE will generally be the voltage level of the pad 110.

The transistors 150 and 152 generally form the n-well biasing circuit 126. When the pad voltage is less than VCCIO+VTP, the transistor 150 generally drives the signal NSUB to VCCIO. When the pad voltage is greater than VCCIO+VTP, the transistor 152 generally switches on to pull the signal NSUB to PAD level.

When the input/output circuit is tristated and the signal CLAMP_EN is not asserted (e.g., clamping function is not on), the transistors 148 and 164 generally drive the signals PGATE and PUB, respectively, to the PAD level when the pad voltage is greater than VCCIO+VTP. When the input/output circuit is not tristated (e.g., the signal OUTPUT_EN is asserted) or the signal CLAMP_EN is asserted (e.g., clamping function is on), the transistors 148 and 164 are generally overpowered.

The circuit 100 may provide two paths for the clamp current when the signal PAD has a voltage level greater than VCCIO+VTP and the clamp function is enabled. The first path may be through the output driver PMOS transistor 166, since the signal PUB is generally held at VCCIO. The transistors 156 and 160 are generally implemented stronger than the transistor 164 (which is also switched on when PAD>VCCIO+VTP). The second path may be through the P+ diffusion-Nwell diode 168 in series with transistor 150.

TABLE 1 shows example states of the circuit 100. The column labeled 'HV?' is generally 'Y' for the high voltage tolerant cases (e.g., PAD>VCCIO+VTP).

Figure 1:
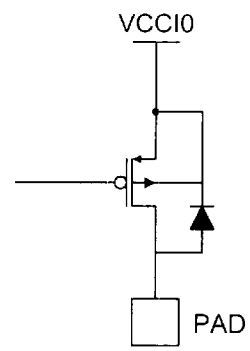
FIG. 1 is a diagram of a PMOS output driver circuit.
Figure 3:
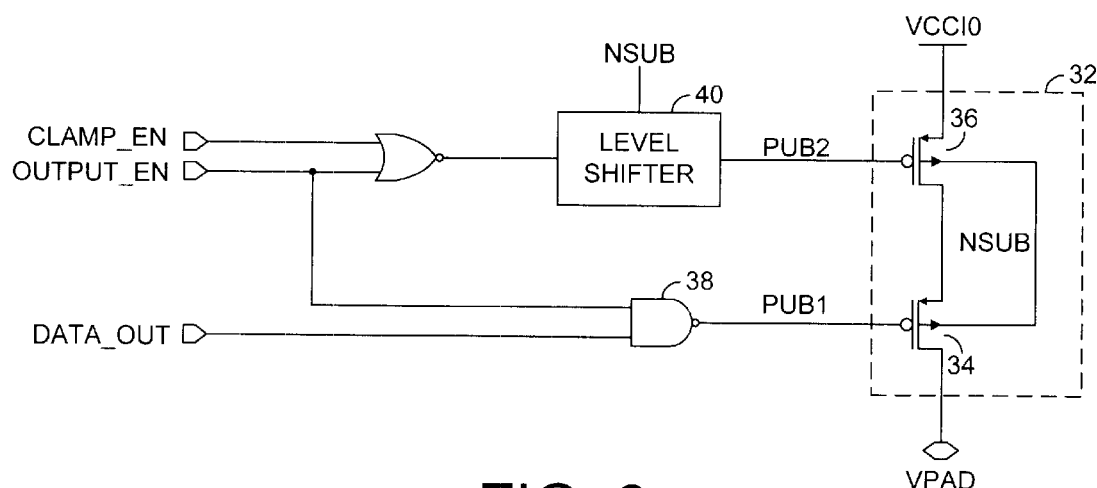
FIG. 3 is a diagram of a circuit illustrating a brute force implementation of a high voltage tolerant I/O circuit with clamp capability.
Figure 2:
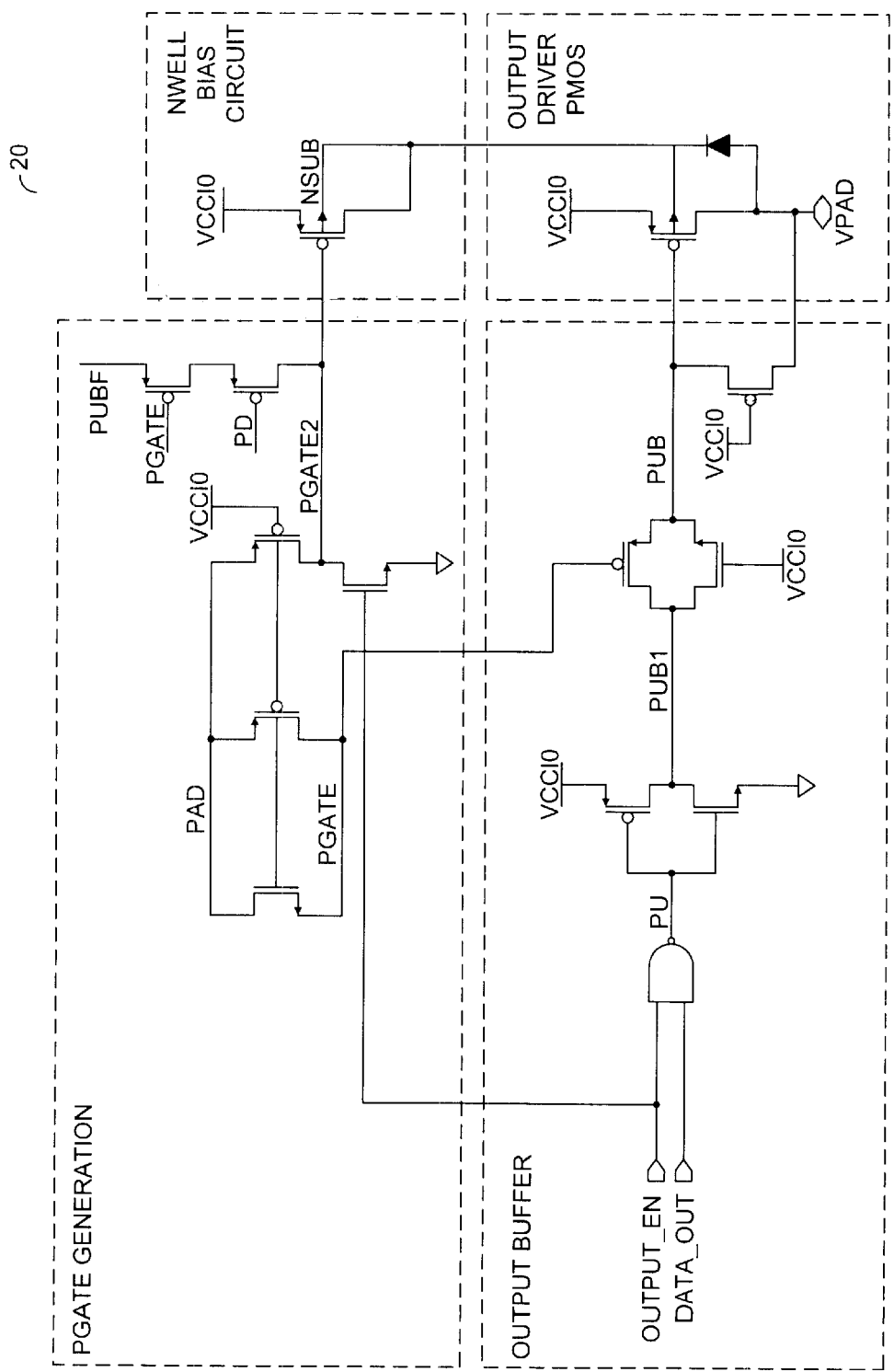
FIG. 2 is a diagram of a high voltage tolerant output driver circuit.

The present invention may combine the signals PGATE and PGATE2 (shown in FIG. 1) into a single signal (e.g., PGATE). The signal PGATE is generally switched in response to the signals OUTPUT_EN and CLAMP_EN allowing the two clamp paths described above to be configurable.

The present invention may provide a high voltage tolerance feature that may be switched ON or OFF. The present invention may allow an I/O circuit to implement I/O standards requiring a clamp to VCCIO along with standards requiring high voltage tolerance. The present invention may provide a method for modifying an I/O circuit to use the existing PMOS output driver and tolerance circuit to clamp the pad, without adding significant area and without causing speed impact. The present invention may allow an I/O circuit that supports multiple I/O standards (some of which require high voltage tolerance) to also comply with the PCI spec, rev 2.2, without the addition of an external clamping diode.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   one or more input/output circuits that are configured as (i) high voltage tolerant in response to a first state of an enable input, and (ii) as a clamp to a power supply voltage in response to a second state of said enable input, wherein said input/output circuits comprise
   (A) an output circuit configured to present an output to a pad in response to a data input, a control input, and a bias input and
   (B) a control circuit configured to generate said control input and said bias input in response to said enable input, and a voltage level at said pad, wherein said control circuit comprises (a) a generation circuit configured to generate said control input in response to said enable input and said voltage level at said pad and (b) a bias circuit configured to generate said bias input in response to said control input and said voltage level at said pad.

TABLE 1

| # | clamp_en | output_en | HV? | pgate | nsub | pub | Comment |
|---|---|---|---|---|---|---|---|
| 1 | 0 | 0 | N | 0 up to vccio-vtn | vccio | vccio | tri-state, no overvoltage |
| 2 | 0 | 0 | Y | pad | pad | pad | tri-state in overvoltage, no clamp |
| 3 | X | 1 | N | 0 | vccio | vccio/0 | output enabled |
| 4 | X | 1 | Y | 0 | pad-vbe | vccio/0 | output enabled; pad>vccio is clamped; (should only be a transient condition) |
| 5 | 1 | 0 | N | 0 | vccio | vccio | tri-state, no overvoltage |
| 6 | 1 | 0 | Y | 0 | pad-vbe | vccio | tri-state in overvoltage, with pci clamp on; pub stays at vccio to clamp the PAD. |

2. The apparatus according to claim 1, wherein said high voltage tolerance feature can be switched on or off.

3. The apparatus according to claim 1, wherein when said input/output circuit is configured as a clamp, a PMOS output driver and tolerance circuit are used to clamp a pad to said power supply voltage.

4. The apparatus according to claim 1, wherein said clamp feature complies with the PCI specification, revision 2.2.

5. The apparatus according to claim 1, wherein said bias circuit comprises:

a first transistor having (i) a gate configured to receive said control signal, (ii) a source connected to said power supply voltage, and (iii) a drain and a substrate terminal connected together; and a second transistor having (i) a gate connected to said power supply voltage, (ii) a drain connected to said pad, and (iii) a source and a substrate terminal connected to said drain and substrate terminal of said first transistor.

6. The apparatus according to claim 1, wherein said generation circuit comprises:

a first gate configured to generate an intermediate output in response to said enable input; and a second gate configured to generate a digital complement of said intermediate output.

7. The apparatus according to claim 1, wherein said control input is at a power supply ground potential when said enable input is in said second state and at said voltage level of said pad when said enable input is in said first state and said pad voltage is greater than said power supply voltage.

8. The apparatus according to claim 1, wherein (i) said generation circuit comprises a pgate generation circuit and (ii) said bias circuit comprises an n-well bias circuit.

9. An apparatus comprising:

means for providing high voltage tolerance to a voltage level on a pad that is greater than a power supply voltage;

means for clamping said pad to said power supply voltage;

means for enabling either said providing means or said clamping means in response to an enable input;

means for generating said control input in response to said enable input and said voltage level at said pad; and means for generating said bias input in response to said control input and said voltage level at said pad.

10. A method for configuring an input/output circuit as a high voltage tolerant circuit or a PCI clamp circuit comprising the steps of:

(A) generating a control input and a bias input in response to an enable input and a voltage level at a pad; and (B) generating an output at said pad in response to a data input, said control input, and said bias input, wherein (a) said control signal is generated in response to said enable input and said voltage level at said pad and (b) said bias input is generated in response to said control input and said voltage level at said pad.

11. The method according to claim 11, wherein said bias input is the greater of said voltage level at said pad or a power supply voltage.

12. The method according to claim 10, wherein said control input is generated in further response to a second enable input.

13. The method according to claim 10, wherein the bias input is presented to an n-well of one or more PMOS transistors.

14. The method according to claim 10, further comprising the step of:

(C) clamping said pad to said power supply voltage in response to a first state of said control input.

15. The method according to claim 10, further comprising the step of:

(D) switching said high voltage tolerance on or off based upon a state of a second enable input.

16. The method according to claim 10, wherein the step (A) further comprising the sub-step of:

(A-1) preventing said bias input from floating.

17. The method according to claim 10, wherein step (A) comprises the sub-steps of:

(A-1) when said enable signal is in a first state, generating said control signal at a power supply ground potential;

(A-2) when said enable signal is in a second state and said pad voltage is less than a power supply voltage plus a first threshold voltage, generating said control signal having a voltage level less than said power supply voltage minus a second threshold; and (A-3) when said enable signal is in said second state and said pad voltage is greater than said power supply voltage plus said first threshold, generated said control signal having said pad voltage.

* * * * *